(12) United States Patent
Raghu et al.

(10) Patent No.: US 9,177,673 B2
(45) Date of Patent: *Nov. 3, 2015

(54) SELECTION OF DATA FOR REDUNDANCY CALCULATION BY LIKELY ERROR RATE

(71) Applicant: SanDisk Technologies Inc., Plano, TX (US)

(72) Inventors: Deepak Raghu, Milpitas, CA (US); Gautam A. Dusija, Milpitas, CA (US); Chris Avila, Saratoga, CA (US); Yingda Dong, San Jose, CA (US); Man Mui, Fremont, CA (US); Xiying Costa, Milpitas, CA (US); Pao-Ling Koh, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 39 days.

This patent is subject to a terminal disclaimer.

(21) Appl. No.: 14/064,887

(22) Filed: Oct. 28, 2013

(65) Prior Publication Data

US 2015/0121157 A1    Apr. 30, 2015

(51) Int. Cl.
*G11C 29/56* (2006.01)
*G11C 29/00* (2006.01)
*G11C 16/04* (2006.01)
*G11C 16/10* (2006.01)
*G11C 29/08* (2006.01)
*G11C 29/04* (2006.01)

(52) U.S. Cl.
CPC ............ *G11C 29/82* (2013.01); *G11C 16/0483* (2013.01); *G11C 16/10* (2013.01); *G11C 29/08* (2013.01); *G11C 29/838* (2013.01); *G11C 2029/0411* (2013.01)

(58) Field of Classification Search
CPC .......................................................... G11C 29/56
USPC ................................ 714/719, 764, 733, 6.12
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,200,350 A | 4/1993 | Gill et al. |
| 5,238,855 A | 8/1993 | Gill |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,663,901 A | 9/1997 | Wallace et al. |
| 5,671,239 A | 9/1997 | Higashitani et al. |
| 5,768,192 A | 6/1998 | Eitan |
| 5,903,495 A | 5/1999 | Takeuchi et al. |

(Continued)

OTHER PUBLICATIONS

U.S. Appl. No. 13/791,200 entitled "Optimized Configurable NAND Parameters," filed Mar. 8, 2013, 37 pages.

(Continued)

*Primary Examiner* — Fritz Alphonse
(74) *Attorney, Agent, or Firm* — Davis Wright Tremaine LLP

(57) ABSTRACT

Layers in a multi-layer memory array are categorized according to likely error rates as predicted from their memory hole diameters. Data to be stored along a word line in a high risk layer is subject to a redundancy operation (e.g. XOR) with data to be stored along a word line in a low risk layer so that the risk of both being bad is low.

17 Claims, 15 Drawing Sheets

(56) References Cited

U.S. PATENT DOCUMENTS

| | | | |
|---|---|---|---|
| 5,907,171 | A | 5/1999 | Santin et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,733,720 | B2 | 6/2010 | Joshi et al. |
| 8,472,257 | B2 | 6/2013 | Dong et al. |
| 8,830,717 | B2 | 9/2014 | Avila et al. |
| 8,832,373 | B2 | 9/2014 | Colgrove et al. |
| 8,868,825 | B1 | 10/2014 | Hayes et al. |
| 8,891,303 | B1 * | 11/2014 | Higgins et al. ............. 365/185.1 |
| 2005/0160217 | A1 | 7/2005 | Gonzalez et al. |
| 2011/0267885 | A1 | 11/2011 | Kato |
| 2012/0001247 | A1 | 1/2012 | Alsmeier |
| 2012/0220088 | A1 | 8/2012 | Alsmeier |
| 2013/0107628 | A1 | 5/2013 | Dong et al. |

OTHER PUBLICATIONS

U.S. Appl. No. 61/731,198, filed Nov. 29, 2012, 32 pages.
U.S. Appl. No. 61/731,215, filed Nov. 29, 2012, 42 pages.
U.S. Appl. No. 14/064,823, filed Oct. 28, 2013, 48 pages.
U.S. Appl. No. 14/064,887, filed Oct. 28, 2013, 42 pages.
Notification of Transmittal of the International Search Report and the Written Opinion of the International Searching Authority, or the Declaration for Int'l Appl. No. PCT/US2014/036545 mailed Oct. 21, 2014, 14 pages.
Park et al., A Fully Performance Compatible 45 mn 4-Gigabit Three Dimensional Double-Stacked Multi-Level NAND Flash Memory with Shared Bit-Line Structure, IEEE Journal of Solid-State Circuits, vol. 44, No. 1, Jan. 2009, pp. 208-216.
Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 13/801,741 entitled "Weighted Read Scrub for Nonvolatile Memory," filed Mar. 3, 2013, 45 pages.
U.S. Appl. No. 13/908,905 entitled "Selection of Data for Redundancy Calculation in Three Dimensional Nonvolatile Memory," filed Jun. 3, 2013, 48 pages.
Office Action for U.S. Appl. No. 14/281,243 mailed Dec. 23, 2014, 19 pages.
Office Action for U.S. Appl. No. 14/285,052 mailed Dec. 19, 2014, 15 pages.
Notice of Allowance issued for U.S. Appl. No. 14/285,052 mailed on May 1, 2015, 5 pages.
Office Action for U.S. Appl. No. 13/908,905 mailed Mar. 19, 2015, 23 pages.
Notice of Allowance issued for U.S. Appl. No. 14/281,243 mailed on Apr. 13, 2015, 14 pages.
Notice of Allowance issued in U.S. Appl. No. 13/908,905 mailed on Jul. 17, 2015, 18 pages.

* cited by examiner

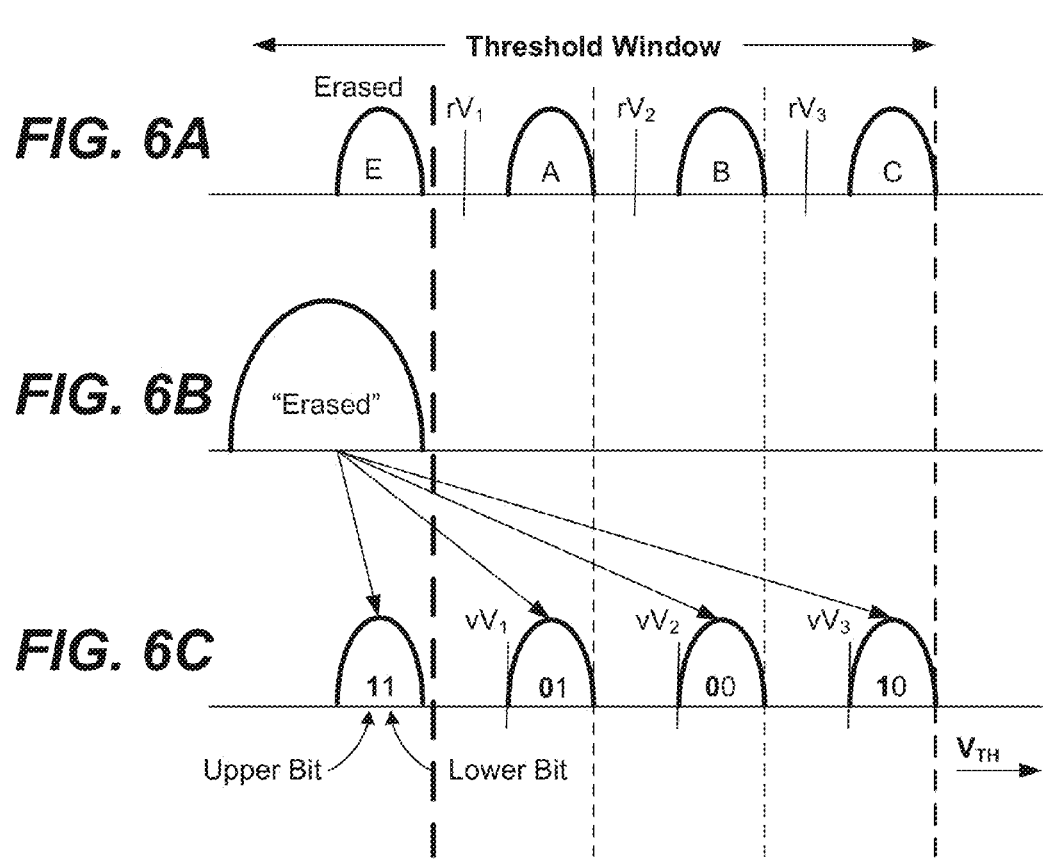

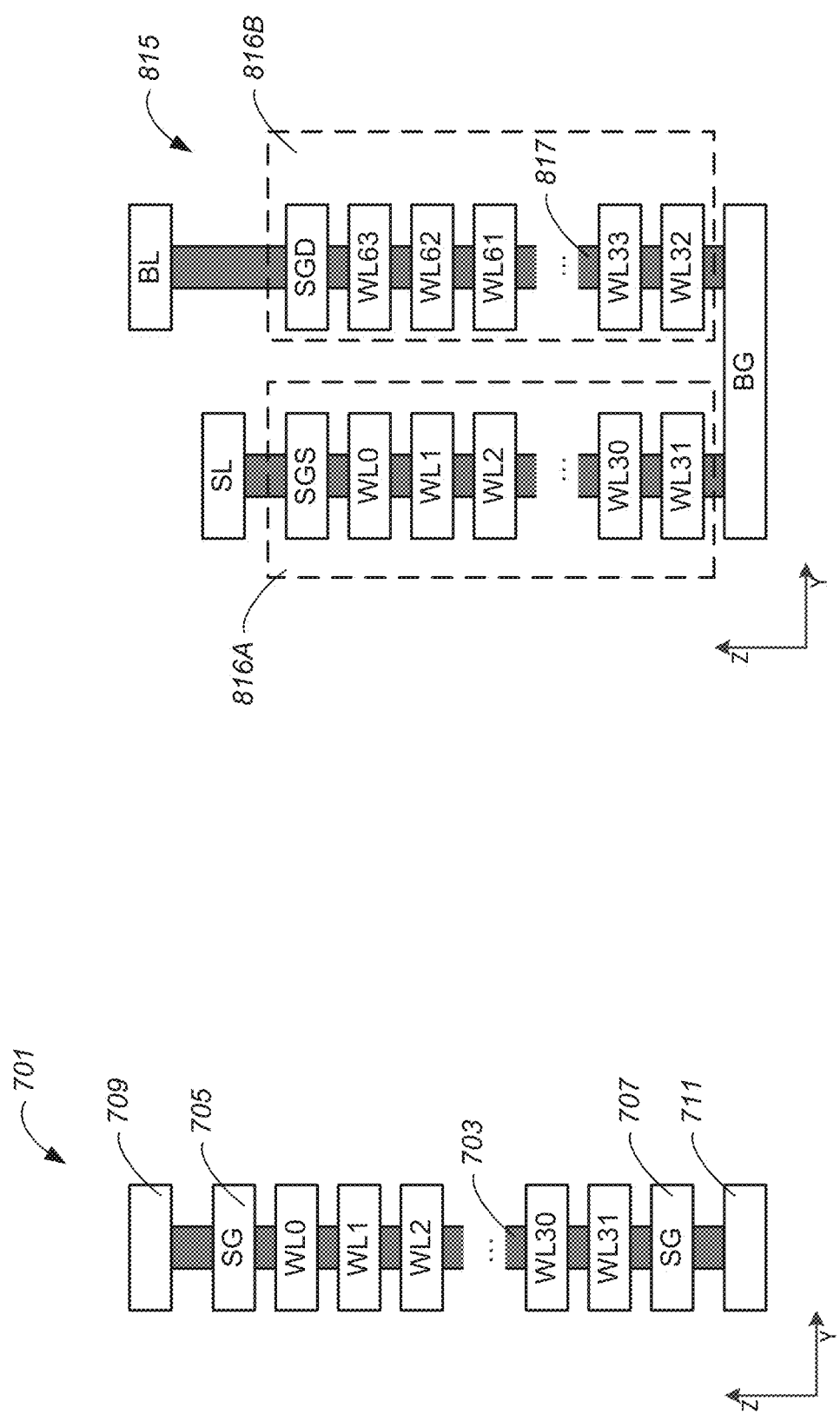

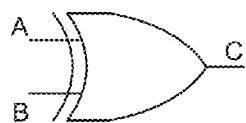
FIG. 13
| A | B | C |
|---|---|---|
| 0 | 0 | 0 |
| 1 | 0 | 1 |
| 0 | 1 | 1 |
| 1 | 1 | 0 |
FIG. 14
| A | 01100110 |
|---|---|
| B | 10001101 |
| C | 11101011 |
FIG. 15
| X | 01100110 |
|---|---|
| Y | 10001101 |
| Z | 11001100 |
| XOR(X,Y,Z) | 00100111 |
FIG. 16
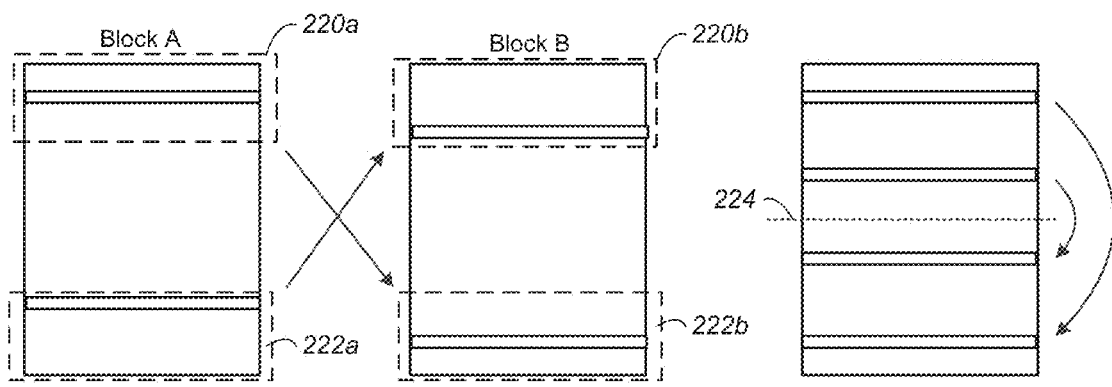
FIG. 17  FIG. 18

SELECTION OF DATA FOR REDUNDANCY CALCULATION BY LIKELY ERROR RATE

BACKGROUND

This application relates to the operation of re-programmable nonvolatile three dimensional memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In a three dimensional memory array that has multiple layers of memory cells, layers are categorized according to likely error rates as predicted from their memory hole diameters. Layers with small memory hole diameters are categorized as high risk. Layers with large memory hole diameters are categorized as low risk. Data to be stored along a high risk word line is subject to an Exclusive OR (XOR) operation with data to be stored along a low risk word line so that the risk of both being bad is low. When any data is read from the memory array and is found to be uncorrectable by ECC (UECC), it is recovered by reversing the XOR operation.

An example of a method of operating a three-dimensional NAND memory includes: categorizing word lines in a block of the three-dimensional NAND memory into a plurality of categories according to predicted error rates for the word lines; selecting data assigned to a first word line from a first category for an exclusive OR (XOR) operation, the first category having a high predicted error rate; selecting data assigned to a second word line from a second category for the XOR operation, the second category having a low predicted error rate; and performing the XOR operation on the data assigned to the first and second word lines to generate XOR data.

The categorizing may categorize word lines according to predicted error rates by their physical levels with respect to a substrate on which the three-dimensional NAND memory is formed, all word lines of a particular level being assigned to the same category. Levels may be assigned to categories according to estimated memory hole diameters for different levels. The estimated memory hole diameters may be obtained from testing performed on word lines of the block. The estimated memory hole diameters may be obtained from testing performed on word lines of at least one other block that is on the same memory die as the block. The first category of word lines may include word lines from levels with small memory hole diameters and the second category of word lines may include word lines from levels with large memory hole diameters.

An example of a method of operating a three-dimensional memory array that includes multiple NAND strings, each NAND string having a plurality of memory cells in a plurality of levels connected in series, includes: categorizing the plurality of levels of word lines in a block into at least a first category and a second category according to memory hole diameter, the first category containing word lines having the smallest memory hole diameter in the block, the second category containing word lines having the largest memory hole diameter in the block; selecting first data assigned to a first word line from the first category for an exclusive OR (XOR) operation; selecting second data assigned to a second word line from the second category for the XOR operation; and performing the XOR operation on the first data and the second data to generate XOR data.

The XOR data may be stored at a location outside the first category of levels. The XOR data may be stored along a word line from the second category. The method may further include: subsequently storing the first data, the second data, and the XOR data; subsequently reading the stored first data; performing Error Correction Code (ECC) decoding of the stored first data; and subsequently, in response to determining that the stored first data is Uncorrectable by ECC (UECC), performing an XOR operation on the stored second data and the stored XOR data to regenerate the first data. Categorizing the plurality of levels of word lines in the block may further include categorizing levels with intermediate memory hole diameters into at least a third category. XOR operations may be performed between two or more portions of data assigned to be stored in the third category levels. Levels may be categorized into a plurality of categories and categories that are equidistant from a plane that is mid-way between a topmost layer and a bottommost layer may be paired for XOR operations so that data assigned to a particular category is XORed with data assigned to another category that is equidistant from the plane and is on the opposite side of the plane.

An example of a three-dimensional NAND memory includes: an array of memory cells arranged in a plurality of levels including high risk levels close to a substrate and low risk levels farther from the substrate; a plurality of memory hole structures extending vertically through the plurality of levels to connect memory cells of the plurality of levels in NAND strings; and an exclusive OR (XOR) circuit configured to perform an XOR operation on a portion of data assigned to a high risk level with a portion of data assigned to a low risk level.

An Error Correction Code (ECC) circuit may be configured to encode data prior to storage in the array of memory cells, to decode data that is read from the array of memory cells, and to identify when data that is read from the array of memory cells is uncorrectable. The XOR circuit may be further configured to regenerate a portion of data when the portion of data is identified as uncorrectable by the ECC circuit. The plurality of levels may further include medium risk levels that are physically located between the high risk levels and the low risk levels.

Various aspects, advantages, features and embodiments of the present invention are included in the following description of examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIG. 13 shows an XOR circuit schematically.

FIG. 14 is a truth table for an XOR circuit.

FIG. 15 illustrates an example of XORing two portions of data.

FIG. 16 illustrates an example of XORing three portions of data.

FIG. 17 illustrates XORing high risk data from one block with low risk data from another block.

FIG. 18 illustrates XORing high risk data and low risk data from the same block.

DETAILED DESCRIPTION

Memory System

Figure 1:
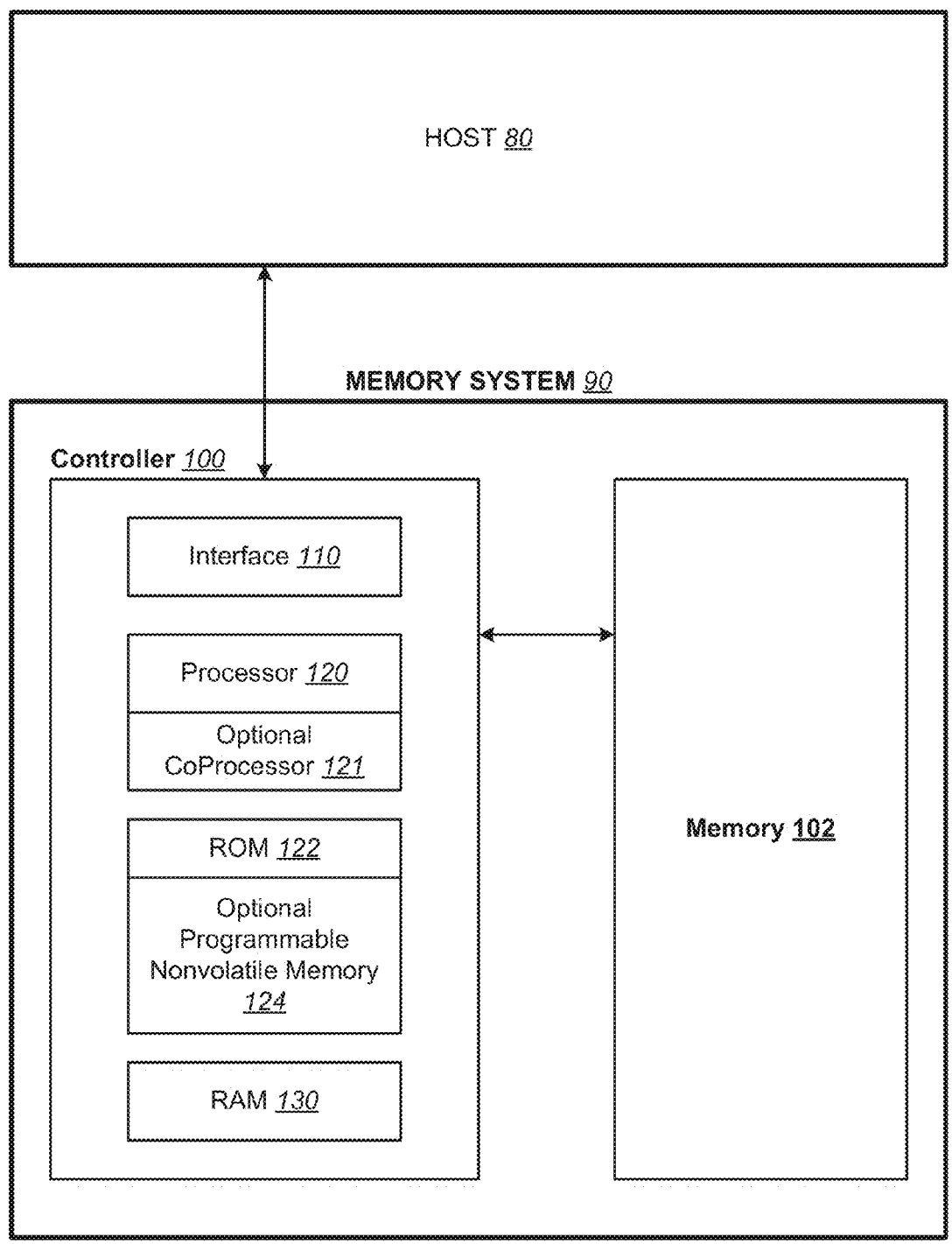
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
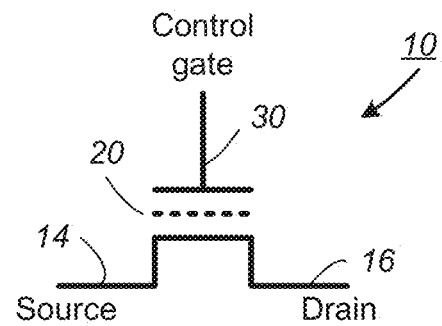
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
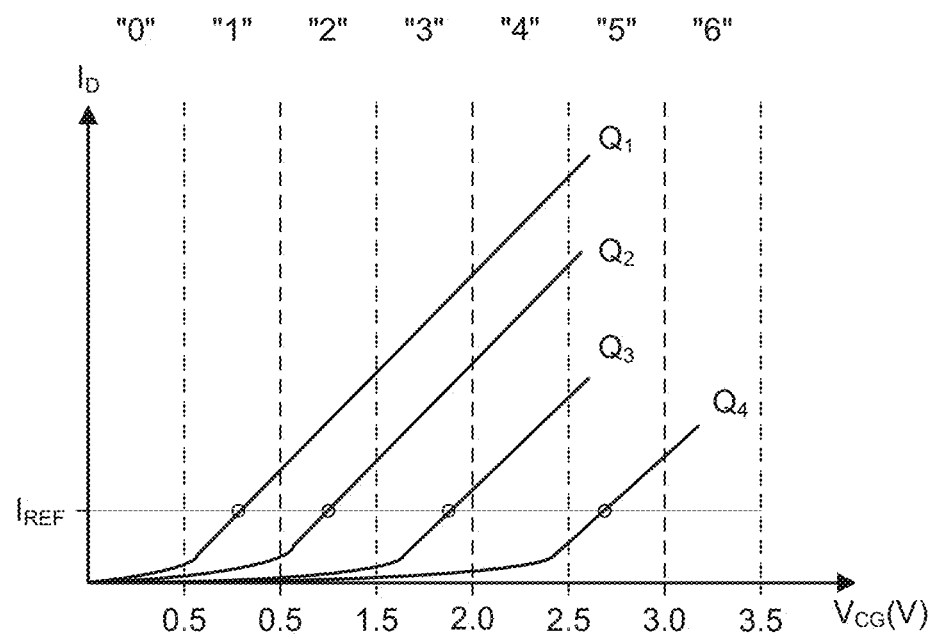
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from –1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
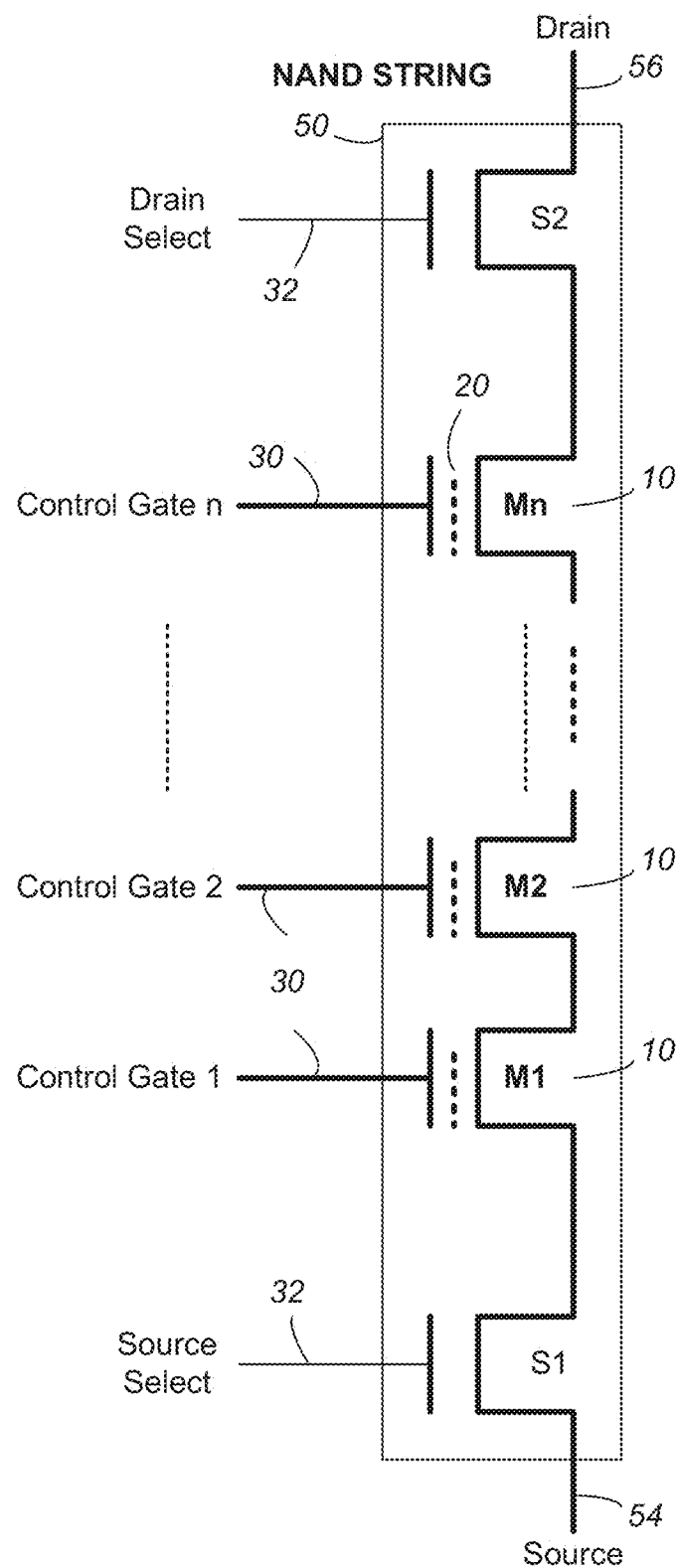
FIG. 4A illustrates schematically a string of memory cells organized into a NAND string.

FIG. 4A illustrates schematically a string of memory cells organized into a NAND string. A NAND string 50 comprises a series of memory transistors M1, M2, Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
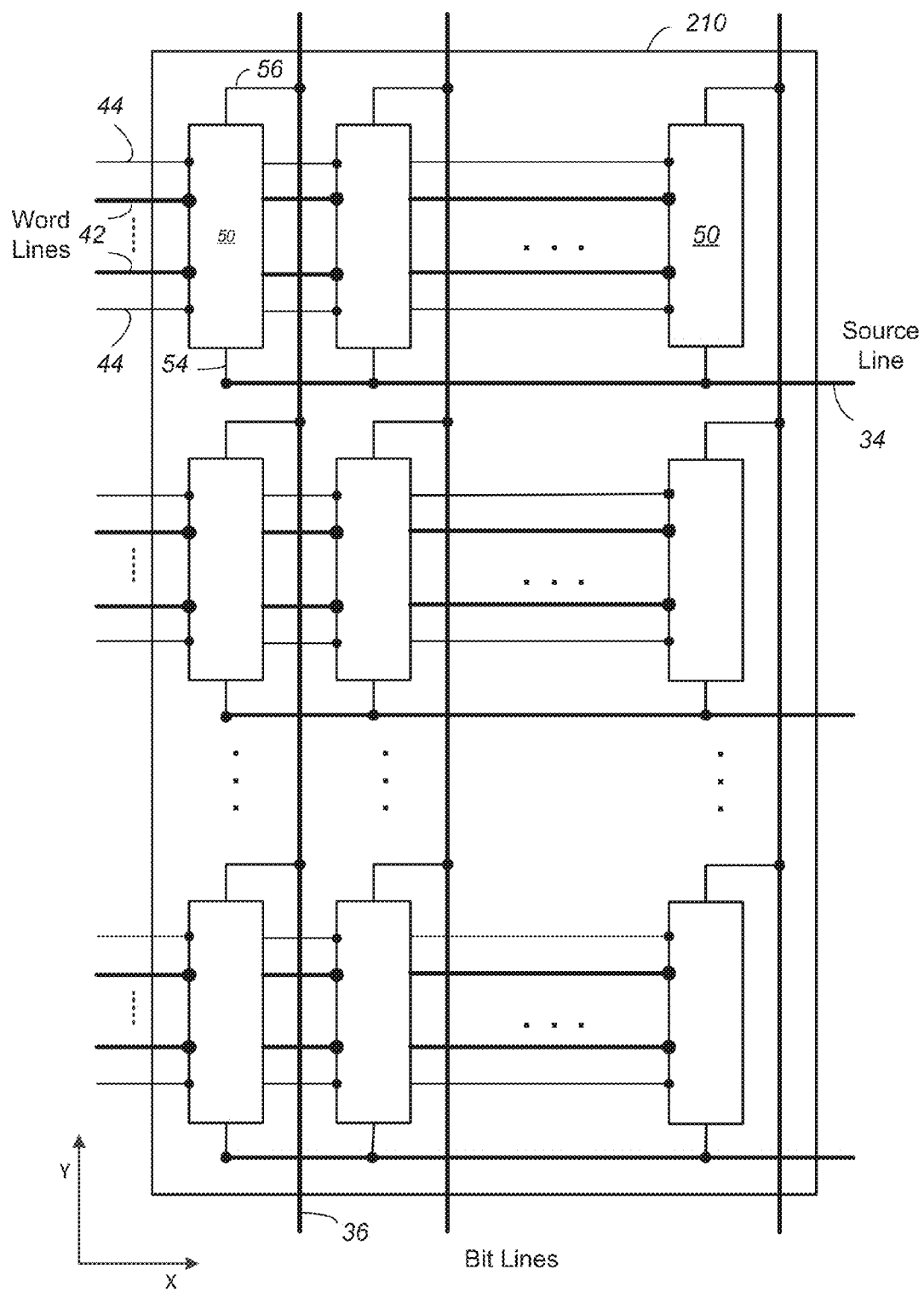
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
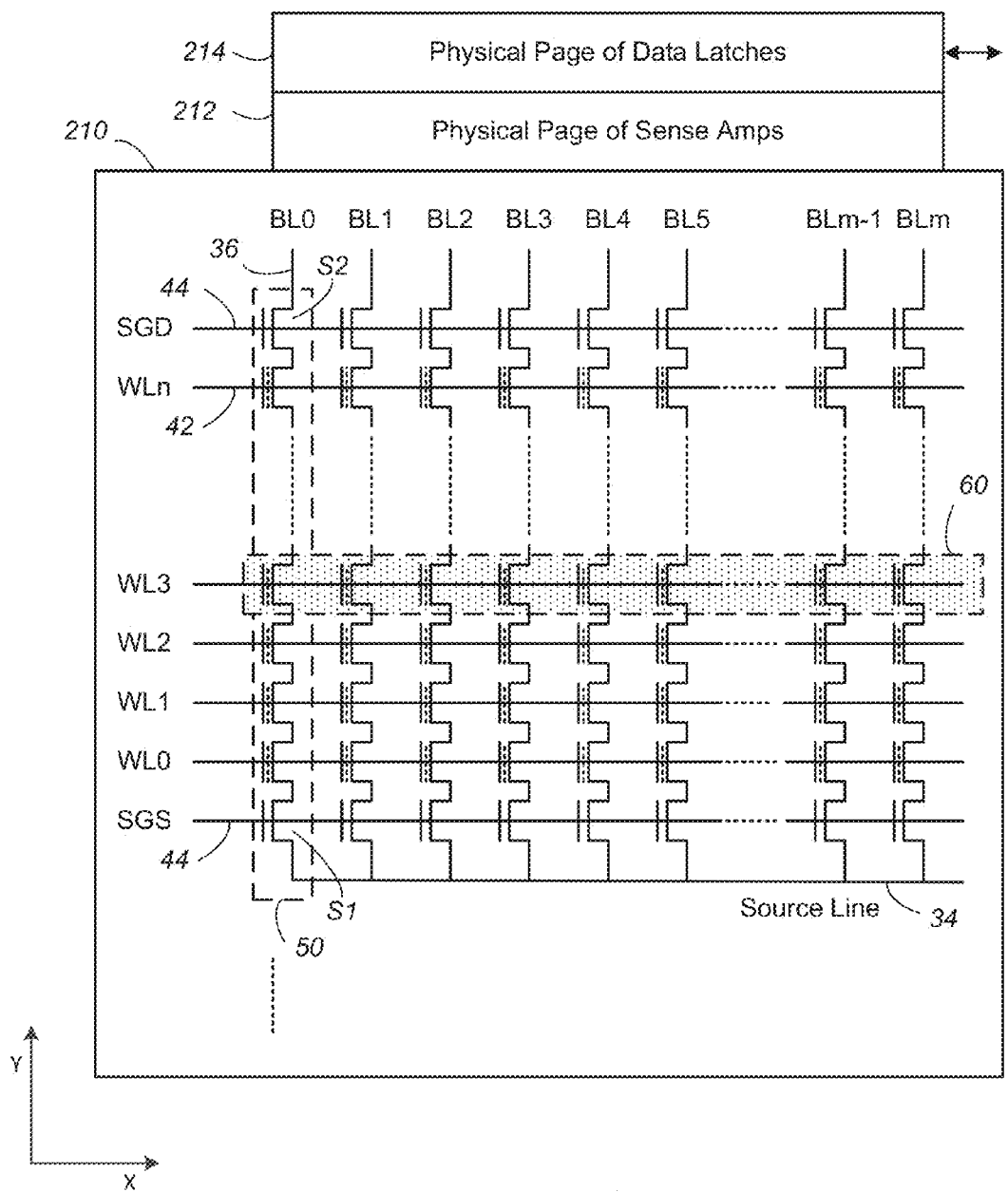
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
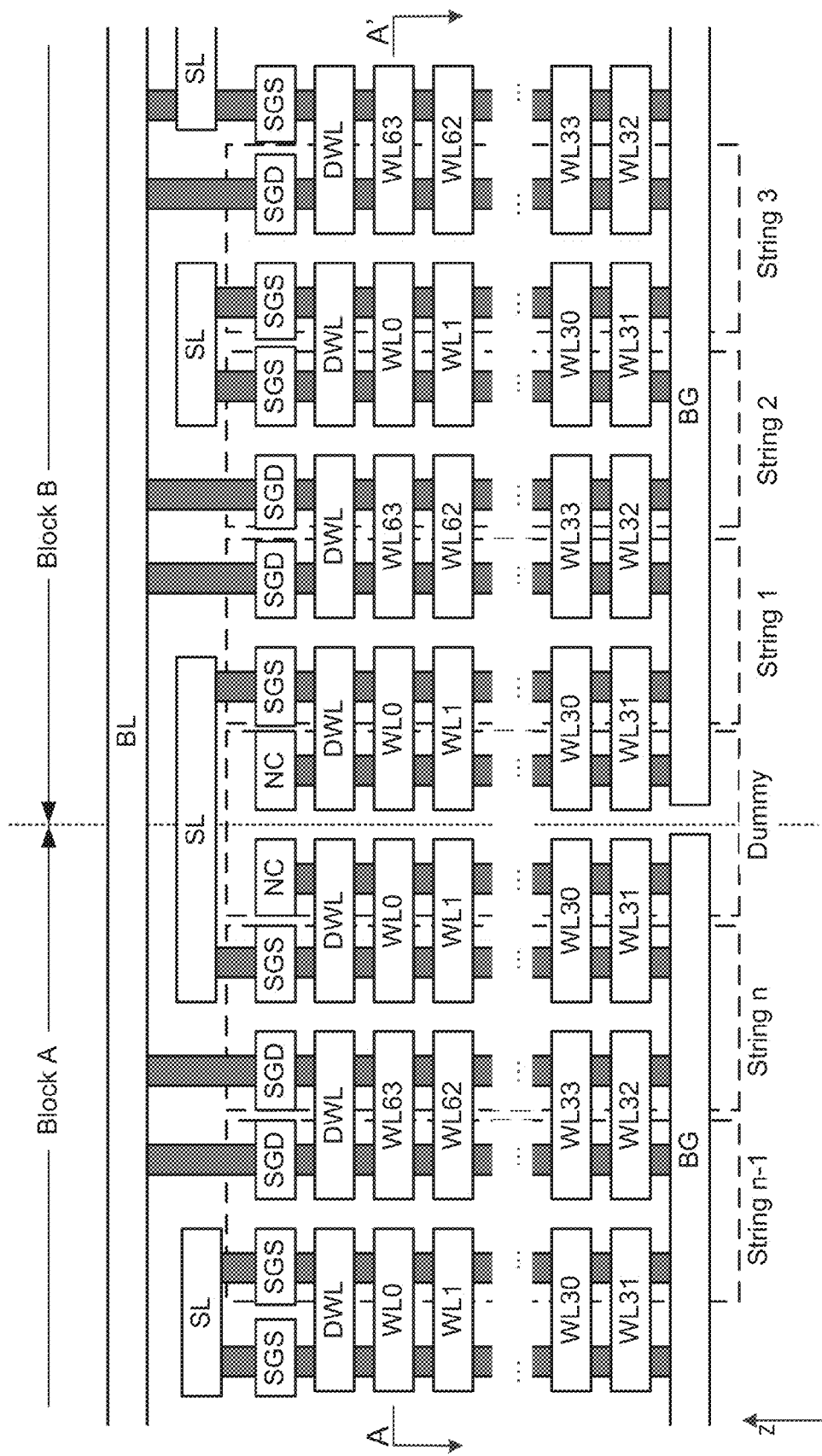
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32 WL63 that are formed by common conductive strips. In contrast, select lines are not shared between neighboring strings. This allows separate selection of an individual set of strings within a block, even though the selected set of strings may include word lines that are not separately controllable from word lines of unselected strings.

Figure 9B:
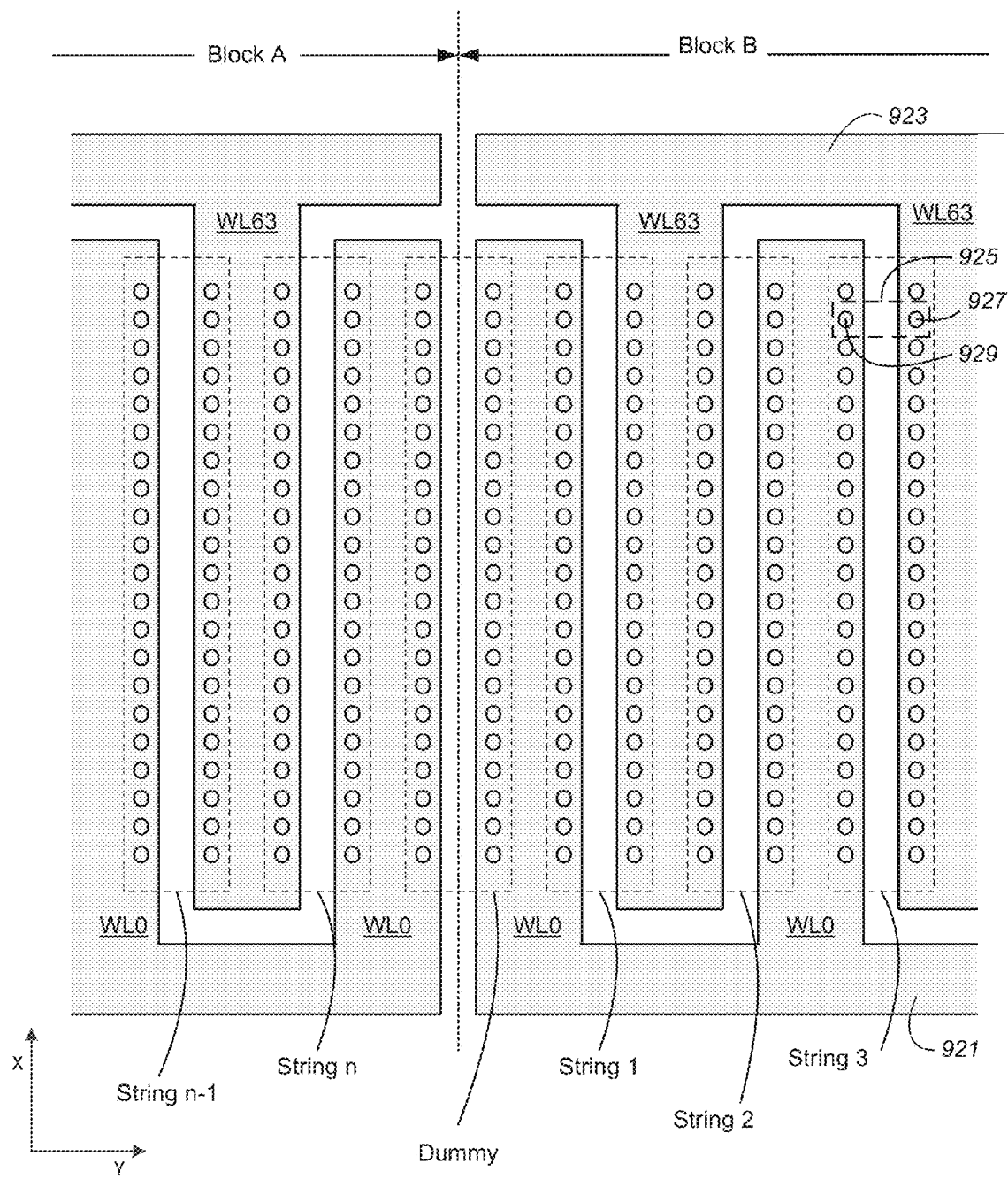
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL63 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the x-direction). For example, one such set is made up of all strings indicated by "String 3" in Block B, including string 925.

Figures 10A, 10B:
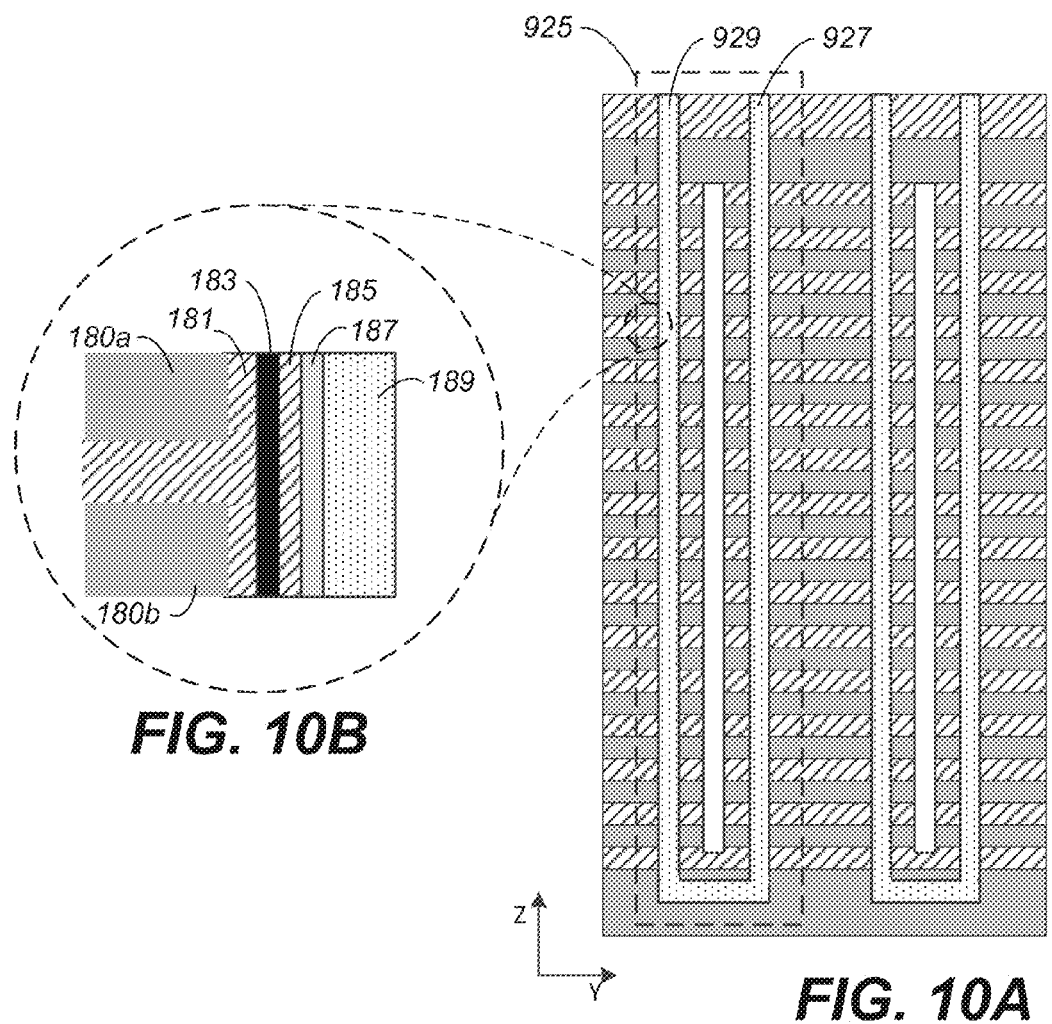
FIGS. 10A-10B show a three dimensional NAND string structure.

FIG. 10A shows a cross section along a y-z plane that intersects memory holes 927, and 929 of NAND string 925 so that the structures formed within memory holes (memory hole structures) may be clearly seen. FIG. 10B shows the structure of a stack of layers in the memory hole 929 where memory cells are formed (the memory hole structure). It can be seen that a blocking dielectric "Block" 181 is deposited on the walls of the memory hole to provide electrical isolation from word lines 180a, 180b. A Charge Trapping Layer (CTL) 183 is deposited on the blocking dielectric 181. The CTL layer 183 forms charge storage elements where the CTL is in close proximity to polysilicon word lines 180a, 180b. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

Figure 11:
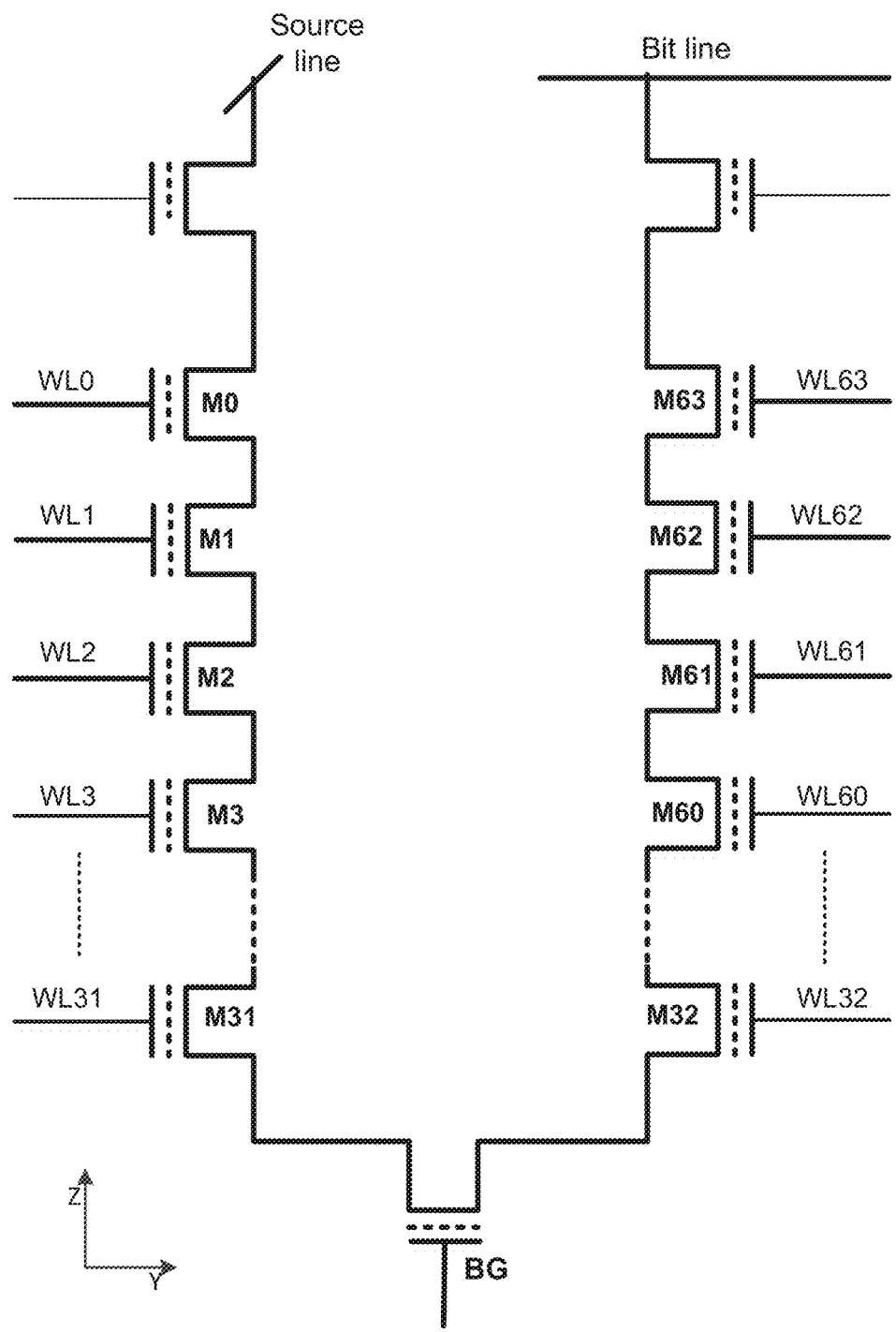
FIG. 11 is a schematic of a NAND string with two wings connected by a back gate.

FIG. 11 shows a schematic of a U-shaped NAND string, similar to the U-shaped NAND strings of FIG. 10A, including memory cells M0-M63. In order to access the cells of the NAND string, appropriate voltages are applied to various lines associated with the NAND string, including the source select line, drain select line, source line, and bit line. Programming, reading, and erasing of memory cells may be performed by applying appropriate voltages using driver circuits in a peripheral area of a memory chip.

One difference between a three dimensional memory array and a two dimensional memory array is that certain physical dimensions of memory cells may vary with the location of the memory cells in the vertical direction. While memory cells in a planar array may be made by process steps that generally have uniform effect across the plane of the substrate, some steps in formation of three dimensional memory arrays are not uniform from layer to layer and may also have significant non-uniformity laterally across a substrate. For example, memory holes may be formed by etching down through multiple layers using an appropriate anisotropic etch. However, such holes may not be perfectly uniform from top to bottom because of the high aspect ratio that is typical of such memory holes. In general, such memory holes are wider towards the top than the bottom. Or, they may be widest somewhere near the top with some narrowing towards the top.

Figure 12:
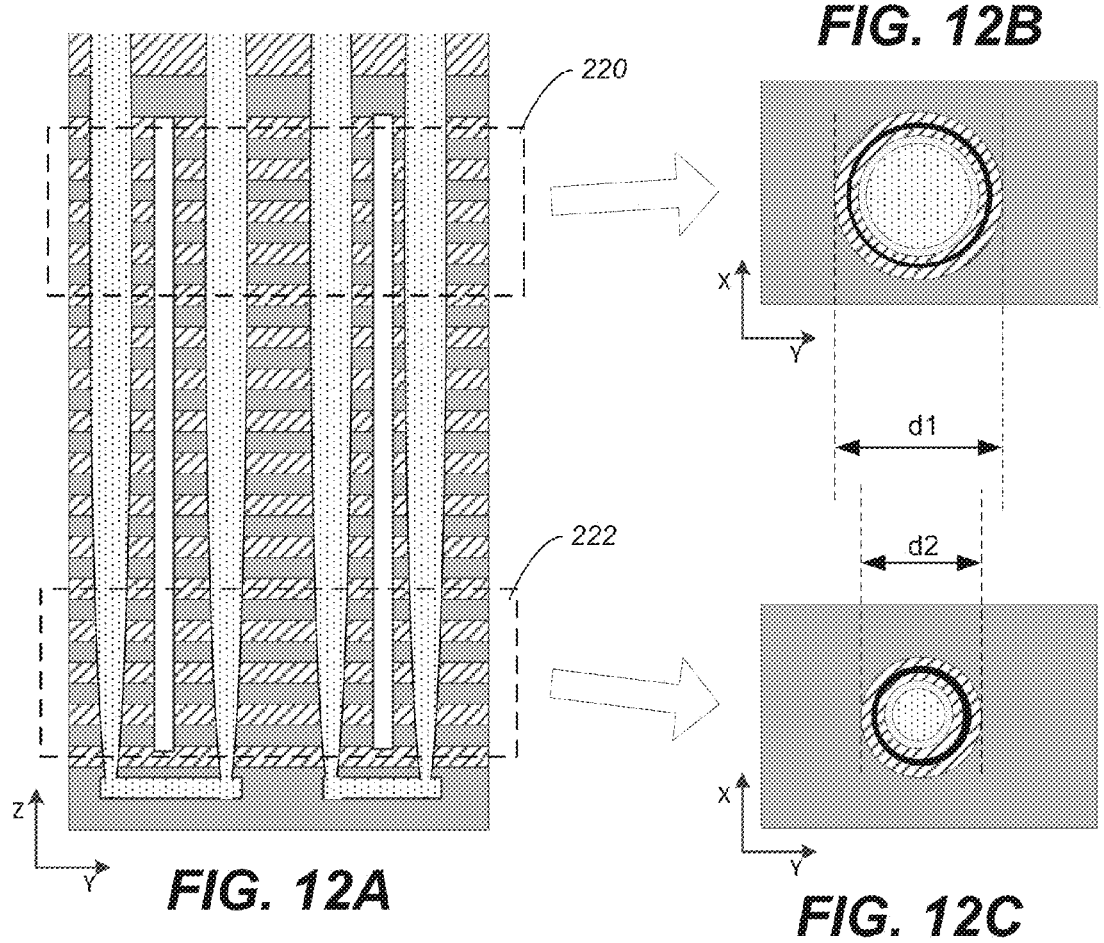
FIG. 12A shows variation in memory hole diameter.
FIG. 12B shows a cross section of a memory hole in an upper level.
FIG. 12C shows a cross section of a memory hole in a lower level.

FIG. 12A shows an example of how memory hole diameter may vary with vertical distance from the substrate. Memory hole diameters are larger towards the top of a memory array compared with the bottom of the memory array. A first set of layers 220 near the top of the memory array have relatively large diameter memory holes. FIG. 12B shows a cross section of a memory hole of the first set of layers 220 having a relatively large diameter, d1 While all memory holes may not be identical throughout the first set of layers 220, they may be similar and fall within a distribution that is generally larger than memory holes lower in the memory array. Therefore all memory cells in the first set of layers 220 may be considered as being in the same category.

FIG. 12A also shows a second set of layers 222 near the bottom of the memory array having relatively small diameter memory holes. FIG. 12C shows a cross section of a memory hole of the second set of layers 222 having a relatively small diameter, d2. While all memory holes may not be identical throughout the second set of layers 222, they may be fall within a distribution that is generally smaller than memory holes higher in the memory array and may therefore be considered as being in the same category. Diameter d2 is significantly less than diameter d1 which leads to a significantly stronger electric field within the memory hole of FIG. 12C compared with FIG. 12B under the same conditions (e.g. when the same voltage is applied to the word line). A higher electric field strength affects the characteristics of memory cells. Higher electric field strength may cause increased wear and earlier failure of memory cells with small memory hole diameters so that there is an increased risk of bad bits in such cells. Because of such risk of early failure, word lines in the second set of layers 222 may be considered to be in a high risk category. In contrast, the relatively large diameter d1 of memory holes in the first set of layers 220 results in lower electric field strength, less wear, and therefore lower risk of errors. Therefore, the first set of layers 220 may be considered to be a low risk category.

Memory hole diameter as a function of location is somewhat predictable because etch chemistry tends to produce larger diameters near the top of an etched memory hole than near the bottom. However, this predictability is limited and there may be significant variation from one memory hole to another. Different dies formed in the same wafer may have memory holes with different profiles. For example, dies near the edge of a wafer may have different memory hole profiles than dies near the center of a wafer. Even within a single die, there may be significant variation from block to block. U.S. Patent application entitled, "Block structure profiling in three dimensional memory," filed on or about the same day as the present application, and hereby incorporated by reference in its entirety, describes methods of determining memory hole diameters at different levels using non-destructive techniques. Memory hole profiling may be applied on a die by die basis, or block by block basis, or for other units, allowing customized operating parameters and methods of operation that are adapted to particular memory hole profiles. According to an aspect of the present invention, profiling information, obtained in any suitable manner (destructive or nondestructive testing, or from modeling, or otherwise), may be used to configure a redundancy scheme for recovering uncorrectable data.

Uncorrectable Data

It is common in memory systems to encode data prior to storage using an Error Correction Code (ECC) scheme. When such data is read it is decoded and errors in the read data may be corrected up to some limit. The limit generally depends on the ECC scheme used and in particular on the amount of redundancy added. While a small number of bad bits may be corrected by ECC, large numbers of bad bits may be uncorrectable by ECC ("UECC") so that some other approach is needed.

One approach to UECC data is to recover the original data from some redundancy data that is generated when the data is stored. Such redundancy data is generated by a separate scheme to the ECC scheme used for small numbers of bad bits. Such redundancy data may allow relatively large portions of data to be reproduced in their entirety if the stored copy becomes UECC. Such redundancy schemes may be costly in terms of the space required and the time necessary to generate redundancy data and to reproduce original data when it is needed.

Exclusive OR "XOR"

One system for reproducing original data when a copy in memory is UECC uses redundancy data created by Exclusive OR (XOR) operations applied to multiple portions of data prior to storage. If one of the portions is found to be UECC when it is read from the memory array, the entire portion can be reproduced from the other portions that were XORed together along with the redundancy data generated (i.e. the output of the XOR operation). U.S. patent application Ser. No. 13/908,905, filed on Jun. 3, 2013, entitled, "Selection of data for redundancy calculation in three dimensional nonvolatile memory," which is hereby incorporated by reference in its entirety, describes certain XOR schemes for use in three dimensional memories.

FIG. 13 is a schematic illustrating two inputs A and B that are XORed together (subject to an XOR operation) to provide an output C. FIG. 14 shows a truth table for this operation for each possible input combination. It can be seen that the output is 1 whenever only one of the inputs is 1, i.e. when there is an odd input. The output is 0 whenever the inputs are the same, i.e. whenever there is an even input. While output bit C is calculated from input bits A and B, this can be reversed so that knowing output bit C and one of the input bits, the remaining input bit can be calculated.

FIG. 15 illustrates how multi-bit portions of source data A and B may be XORed together to provide output data C. Each bit in output C is calculated by XORing together corresponding bits in source data A and B as shown in FIG. 14. Output data C may be considered as redundancy data that can be stored with source data A and B. Even if one of the portions of data A or B becomes corrupted or otherwise uncorrectable, the original data can be calculated from the other portions of source data and from redundancy data C.

While the example of FIG. 15 shows a set of two portions of source data used to calculate redundancy data, any number of portions may be dealt with in this way. FIG. 16 shows a set of three portions of source data X, Y, and Z which are XORed together to provide redundancy data XOR(X,Y,Z). The XOR operation may be considered to be an addition modulo 2 operation (i.e. summing bits and taking the least significant bit as the output). This can also be considered an odd/even determination with a given output bit indicating whether the sum of all corresponding input bits is odd or even. Any portion of source data can be calculated from the redundancy data XOR(X, Y, Z) and the other portions of source data. This can be extended to any number of portions of source data.

One limitation of an XOR scheme as illustrated above is that in order to calculate any given portion of data the other portions of data in the set of source data must be available. If more than one portion of data in a set of such portions is unavailable (e.g. UECC), then it may not be possible to use the redundancy data to calculate the original data. Therefore, it is important that no more than one portion of data in any set of portions used for calculating redundancy data becomes UECC.

Aspects of the present invention relate to selecting portions of source data to form a data set for calculation of redundancy data so that the probability of more than one selected portion becoming UECC is low. In particular, such portions may be chosen so that only one portion in any given XOR operation is a high risk portion (other portions are low risk).

According to an aspect of the present invention, memory hole information may be used when selecting data for calculation of redundancy data. For example, knowing which memory holes are narrower gives an indication of which word lines are more at risk of having significant errors (and therefore becoming UECC). Data to be stored along word lines with smaller memory hole diameters may be considered to have a high risk of errors, whereas data to be stored along word lines with larger memory hole diameters may be considered to have a low risk of errors. This may be taken into account when deciding which portions of data to XOR together.

FIG. 17 shows an example of two blocks, A and B. Block A has a high risk category of word lines 222a near the bottom and a low risk category of word lines 220a near the top. Similarly, block B has a high risk category of word lines 222b near the bottom and a low risk category of word lines 220b near the top. Data for an XOR operation may be selected so that a word line from a high risk category is XORed with a word line from a low risk category. In some cases, it is convenient to select a high risk word line from one block and a low risk word line from a different block. In general, data is XORed immediately prior to programming it in the memory array. NAND blocks may be programmed sequentially so that there may be a delay between high risk word line programming and low risk word line programming in the same block. By programming two blocks together, one block may perform high risk programming (near the bottoms of NAND strings) while the other block performs low risk programming (near the tops of NAND strings). Thus, blocks may be paired for purposes of XORing operations with programming in one block preceding programming of the other block by a number of word lines.

While FIG. 17 shows just two categories in each block, a low risk category and a high risk category, there may be additional categories such as one or more medium risk categories. In one example, a single medium risk category extends to include all word lines that are not either high risk or low risk. Thus, for example, all the word lines in layers physically located between high risk category 222a and low risk category 220a of block A in FIG. 17 could form a third category. In other examples, all word lines are either high risk or low risk (e.g. categories 220a and 222a extend to encompass all word lines). Alternatively, a range of different risk categories may be created to reflect a range of risk levels and memory hole diameters. Categories may be configured based on testing that determines memory hole diameters at different levels. Such categorization may be performed block by block, plane by plane, die by die, or otherwise. Thus, a high risk category may include three layers of word lines in one block, die, or plane, and may include five layers of word lines in another block, die, or plane. Categorization may be static throughout the life cycle of a memory or may change as the memory wears and as risk of failure increases.

While examples above refer to XORing of two portions of source data to generate a portion of redundancy data, schemes may XOR three or more portions of data in other examples. When three or more portions of source data are used, only one may be selected from a high risk category so that the risk of having more than one UECC portion of data is low. For example, two word lines from low risk category 220a could be XORed with one word line from high risk category 222a. The numbers of word lines per category may be configured accordingly (i.e. low risk category 220a may be configured to have twice as many word lines or layers as high risk category 222a).

FIG. 18 shows an example in which data is XORed with other data that is stored in the same block. In this case, a block may be considered to be bisected by a plane 224 that divides the top half from the bottom half. Data stored along a given word line in one half is XORed with data of a corresponding word line in the other half that is equidistant from the plane. Thus, high risk word lines are XORed with low risk word lines and medium risk word lines are XORed with medium risk word lines. In other examples, high risk word lines and low risk word lines may be XORed together and medium risk word lines may not be subject to XORing because they have a relatively low risk of data becoming UECC.

When data is XORed, the resulting redundancy data (the product of the XOR operation) is stored in the memory array. The location for storing the redundancy data depends on the memory system. The XOR data may be stored in a dedicated location that may be in a separate set of blocks that are reserved for XOR data. Thus, XOR data from various blocks may be stored together in dedicated XOR data blocks.

Figure 19:
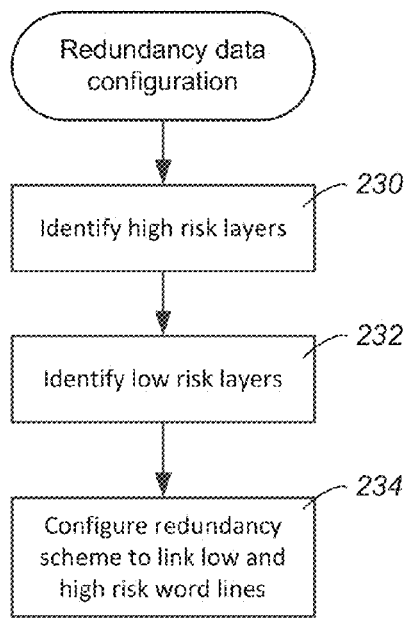
FIG. 19 shows an example of a redundancy data configuration scheme.

FIG. 19 illustrates an example of a configuration operation associated with a redundancy scheme. High risk layers in a multi-layer memory (a three dimensional memory) are identified 230, e.g. by memory hole diameter. Subsequently, low risk layers are identified 232. Low risk layers may include all layers that are not high risk, or may leave some other layers that are neither high nor low risk. Subsequently, a redundancy scheme, such as an XOR scheme, is configured to link low risk word lines and high risk word lines when calculating redundancy data 234.

Figure 20:
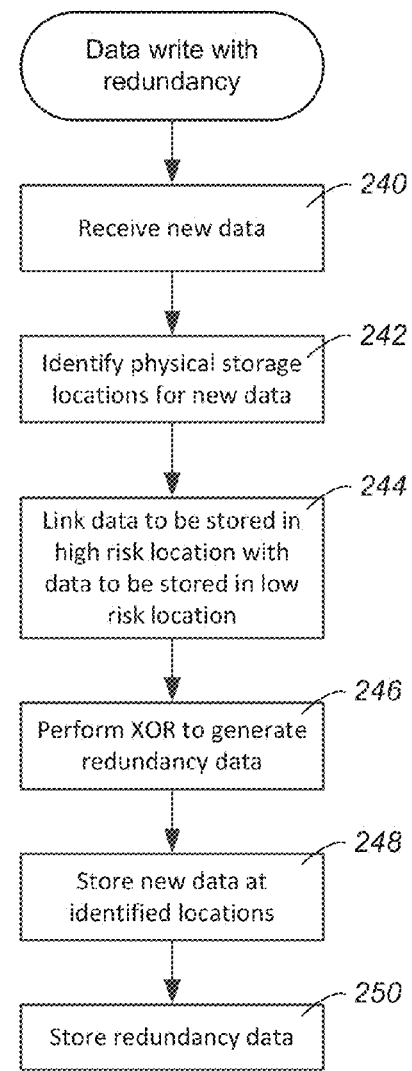
FIG. 20 illustrates a scheme for writing data with redundancy.

FIG. 20 illustrates an example of a redundancy scheme for new data. New data is received 240 and physical locations in the memory array are identified for storing the data 242. Data to be stored in a high risk location (e.g. small memory holes) is linked with data to be stored in a low risk location (e.g. large memory holes) 244. The linked data is then XORed together to generate redundancy data 246. The new data is then stored at the identified locations 248. The redundancy data is also stored in the memory array 250.

Figure 21:
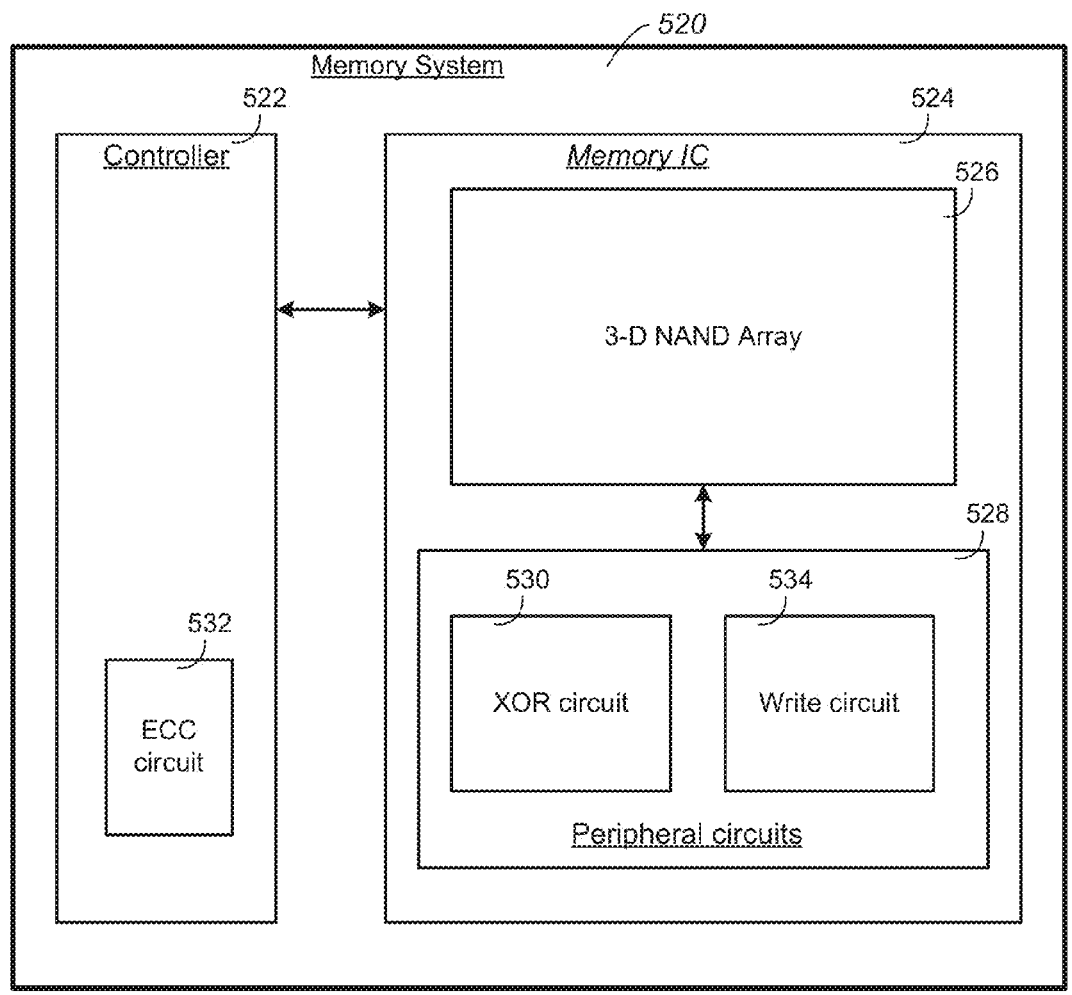
FIG. 21 shows an example of hardware that may be used to implement aspects of the present invention.

FIG. 21 shows an example of hardware that may be used to implement aspects of the present invention. A memory system 520 includes a controller 522 and a memory IC 524. The memory IC 524 includes a 3-D NAND array 526 in which NAND strings are formed using memory holes that extend through multiple layers and that have some variation in memory hole diameter between cells. Layers are categorized according to memory hole diameter into low risk layers with larger memory hole diameters and high risk layers with smaller memory hole diameters. The memory IC also has peripheral circuits 528 including an XOR circuit 530 that XORs selected data prior to storage of selected data in high and low risk layers. The XOR circuit also XORs stored data and redundancy data to regenerate a copy of stored data that is found to be UECC. A write circuit 534 writes the XORed data and the redundancy data in appropriate locations in array 526. An FCC circuit 532 is provided in the controller 522 to encode data prior to storage and to attempt to decode data that is read from the memory array 526.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three-dimensional NAND memory comprising:
    categorizing word lines in a block of the three-dimensional NAND memory into a plurality of categories according to predicted error rates for the word lines;
    selecting data assigned to a first word line from a first category for an exclusive OR (XOR) operation, the first category having a high predicted error rate;
    selecting data assigned to a second word line from a second category for the XOR operation, the second category having a low predicted error rate; and
    performing the XOR operation on the data assigned to the first and second word lines to generate XOR data.

2. The method of claim 1 wherein the categorizing categorizes word lines according to predicted error rates by their physical levels with respect to a substrate on which the three-dimensional NAND memory is formed, all word lines of a particular level assigned to the same category.

3. The method of claim 2 wherein levels are assigned to categories according to estimated memory hole diameters for different levels.

4. The method of claim 3 wherein the estimated memory hole diameters are obtained from testing performed on word lines of the block.

5. The method of claim 3 wherein the estimated memory hole diameters are obtained from testing performed on word lines of at least one other block that is on the same memory die as the block.

6. The method of claim 1 wherein the first category of word lines comprises word lines from levels with small memory hole diameters and the second category of word lines comprises word lines from levels with large memory hole diameters.

7. A method of operating a three-dimensional memory array that includes multiple NAND strings, each NAND string having a plurality of memory cells in a plurality of levels connected in series, comprising:

categorizing the plurality of levels of word lines in a block into at least a first category and a second category according to memory hole diameter, the first category containing word lines having the smallest memory hole diameter in the block, the second category containing word lines having the largest memory hole diameter in the block;

selecting first data assigned to a first word line from the first category for an exclusive OR (XOR) operation;

selecting second data assigned to a second word line from the second category for the XOR operation; and performing the XOR operation on the first data and the second data to generate XOR data.

8. The method of claim 7 further comprising storing the XOR data at a location outside the first category of levels.

9. The method of claim 8 wherein the XOR data is stored along a word line from the second category.

10. The method of claim 7 further comprising:

subsequently storing the first data, the second data, and the XOR data;

subsequently reading the stored first data;

performing Error Correction Code (ECC) decoding of the stored first data; and subsequently, in response to determining that the stored first data is Uncorrectable by ECC (UECC), performing an XOR operation on the stored second data and the stored XOR data to regenerate the first data.

11. The method of claim 9 wherein categorizing the plurality of levels of word lines in the block further includes categorizing levels with intermediate memory hole diameters into at least a third category.

12. The method of claim 11 further comprising performing XOR operations between two or more portions of data assigned to be stored in the third category levels.

13. The method of claim 7 further comprising categorizing levels into a plurality of categories and pairing categories that are equidistant from a plane that is mid-way between a topmost layer and a bottommost layer for XOR operations so that data assigned to a particular category is XORed with data assigned to another category that is equidistant from the plane and is on the opposite side of the plane.

14. A three-dimensional NAND memory comprising:

an array of memory cells arranged in a plurality of levels including high risk levels close to a substrate and low risk levels farther from the substrate;

a plurality of memory hole structures extending vertically through the plurality of levels to connect memory cells of the plurality of levels in NAND strings; and an exclusive OR (XOR) circuit configured to perform an XOR operation on a portion of data assigned to a high risk level with a portion of data assigned to a low risk level.

15. The three-dimensional NAND memory of claim 14 further comprising an Error Correction Code (ECC) circuit that is configured to encode data prior to storage in the array of memory cells, to decode data that is read from the array of memory cells, and to identify when data that is read from the array of memory cells is uncorrectable.

16. The three-dimensional NAND memory of claim 15 wherein the XOR circuit is further configured to regenerate a portion of data when the portion of data is identified as uncorrectable by the ECC circuit.

17. The three-dimensional NAND memory of claim 14 wherein the plurality of levels further includes medium risk levels that are physically located between the high risk levels and the low risk levels.

\* \* \* \* \*